United States Patent
Bang et al.

(10) Patent No.: US 8,189,342 B2
(45) Date of Patent: May 29, 2012

(54) PRINTED CIRCUIT BOARD FOR MEMORY MODULE, METHOD OF MANUFACTURING THE SAME AND MEMORY MODULE/SOCKET ASSEMBLY

(75) Inventors: Hyo-Jae Bang, Cheonan-si (KR); Dong-Chun Lee, Cheonan-si (KR); Ho-Geon Song, Cheonan-si (KR); Seong-Chan Han, Cheonan-si (KR); Kwang-Su Yu, Cheonan-si (KR); Dong-Woo Shin, Cheonan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1085 days.

(21) Appl. No.: 11/500,960

(22) Filed: Aug. 9, 2006

(65) Prior Publication Data
US 2007/0047377 A1    Mar. 1, 2007

(30) Foreign Application Priority Data
Aug. 12, 2005  (KR) .................. 10-2005-0074480

(51) Int. Cl.
*H05K 1/14* (2006.01)
(52) U.S. Cl. .................. 361/785; 361/788; 361/790
(58) Field of Classification Search .................. 361/785, 361/788, 790
See application file for complete search history.

(56) References Cited

U.S. PATENT DOCUMENTS

| | | | | |
|---|---|---|---|---|
| 3,573,617 A | * | 4/1971 | Randolph et al. | 324/755 |
| 4,376,562 A | * | 3/1983 | Kaley | 439/264 |
| 5,177,324 A | * | 1/1993 | Carr et al. | 174/250 |
| 5,495,395 A | * | 2/1996 | Yoneda et al. | 361/765 |
| 5,644,107 A | * | 7/1997 | Kubota et al. | 174/262 |
| 6,034,438 A | * | 3/2000 | Petersen | 257/786 |
| 6,117,707 A | * | 9/2000 | Badehi | 438/113 |
| 6,187,678 B1 | * | 2/2001 | Gaynes et al. | 438/667 |
| 6,239,983 B1 | * | 5/2001 | Shingai et al. | 361/768 |
| 6,287,949 B1 | * | 9/2001 | Mori et al. | 438/612 |
| 6,328,574 B1 | | 12/2001 | Howell | |
| 6,426,466 B1 | * | 7/2002 | Chamberlin et al. | 174/255 |
| 6,451,624 B1 | * | 9/2002 | Farnworth et al. | 438/106 |
| 6,558,169 B2 | * | 5/2003 | Figueroa et al. | 439/70 |
| 6,965,161 B2 | * | 11/2005 | Jun et al. | 257/700 |
| 6,998,344 B2 | * | 2/2006 | Akram et al. | 438/667 |
| 7,750,250 B1 | * | 7/2010 | Kuo | 174/264 |
| 7,791,173 B2 | * | 9/2010 | Park | 257/620 |

FOREIGN PATENT DOCUMENTS

| | | |
|---|---|---|
| JP | 05-291739 | 11/1993 |
| KR | 2003-0087032 | 11/2003 |

\* cited by examiner

*Primary Examiner* — Hung S Bui
(74) *Attorney, Agent, or Firm* — Harness, Dickey & Pierce, P.L.C.

(57) ABSTRACT

Example embodiments of the present invention may include a printed circuit board, a method of manufacturing the printed circuit board, and a memory module/socket assembly. Example embodiments of the present invention may increase the number of contact taps on a memory module, in addition, a force required to insert the memory module into a module socket may be decreased.

10 Claims, 10 Drawing Sheets

ROUTING

PRINTED CIRCUIT BOARD FOR MEMORY MODULE, METHOD OF MANUFACTURING THE SAME AND MEMORY MODULE/SOCKET ASSEMBLY

PRIORITY CLAIM

A claim of priority is made to Korean Patent Application No. 10-2005-0074480, filed on Aug. 12, 2005, in the Korean Intellectual Property Office, the disclosure of which is incorporated herein in its entirety by reference.

BACKGROUND OF THE INVENTION

1. Field of the Invention

Example embodiments of the present invention relate to a memory module, and more particularly, to a printed circuit board (PCB) for a memory module, a method of manufacturing the same, and a memory module/socket assembly.

2. Description of the Related Art

Generally, a memory module may include a printed circuit board (PCB) and contact pins or contact taps formed on the PCB. A memory module may be electrically connected to, for example, a socket provided on a main board of an electronic device.

Figure 1:
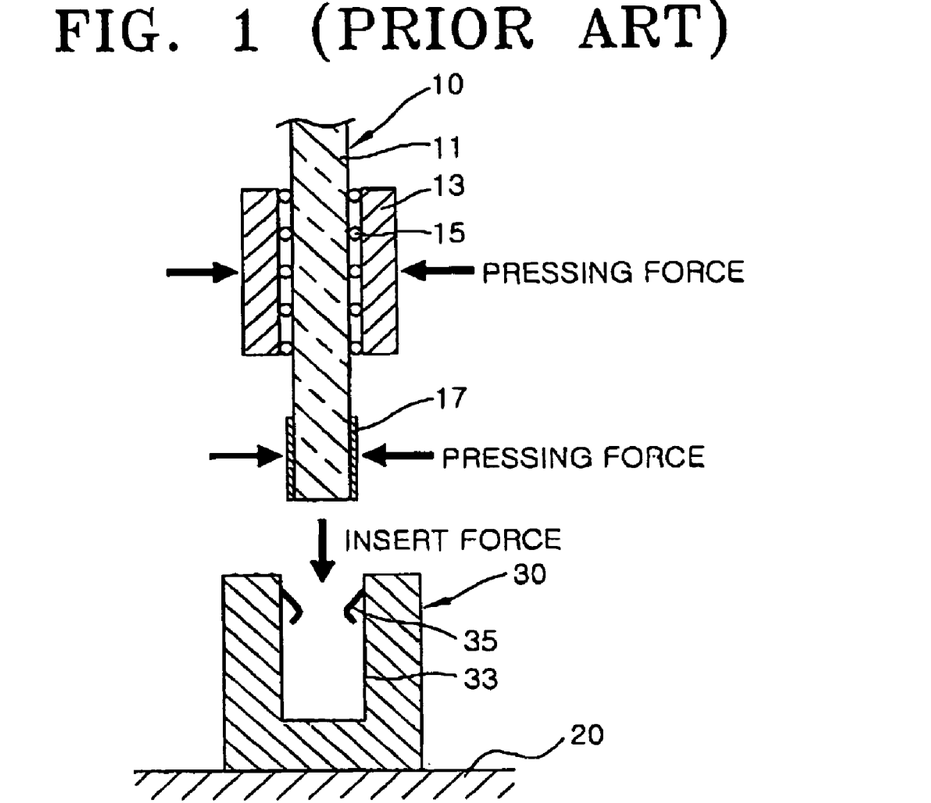
FIG. 1 is a sectional view schematically illustrating a prior art memory module/socket assembly.

FIG. 1 is a sectional view schematically illustrating a memory module/socket assembly according to the prior art.

Referring to FIG. 1, a memory module 10 may include a PCB 11 and a memory package 13 mounted on the PCB 11. The memory package 13 may be mounted on the PCB by, for example, solder balls 15. Contact taps 17 may be formed on both opposite surfaces of an end portion of the PCB 11.

The memory module 10 may be inserted into a groove 33 formed on a body of a module socket 30 assembled on a main board 20. The contact taps 17 may electrically contact contact pins 35 provided on an inner wall of the groove 33.

However, as a capacity of a semiconductor device, for example, a memory device, is increased, the number of modules for electrically connecting the memory device to an external device, for example, a personal computer (PC), and the number of contact pins 35 and contact taps 17 used for the electrical connection of the memory module 10 to the module socket 30 have increased.

For example, two hundred and forty (240) contact taps may be provided on surfaces of a PCB for a double data rate 2 (DDR2) memory module. However, in order to manufacture a higher density module, additional I/O pins for a power supply and ground may be necessary. Accordingly, the total of 240 contact taps (or contact pins) may be insufficient.

Furthermore, as the number of the contact pins or the contact taps has increased, insert force to appropriately insert a memory module in a module socket has increased from 6 Kgf to 8 Kgf. Thus, pressing force applied from the pins to the taps has also increased. The increase in the forces may cause defects in the memory modules.

Figure 2:
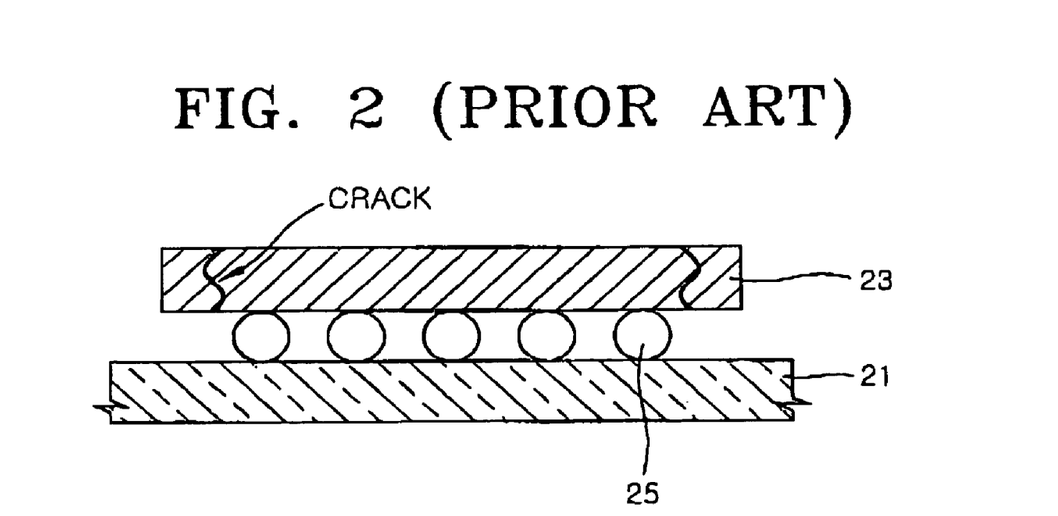
FIGS. 2 through 4 are sectional views illustrating cracks generated on memory packages memory module/socket assemblies of the prior art.
Figure 3:
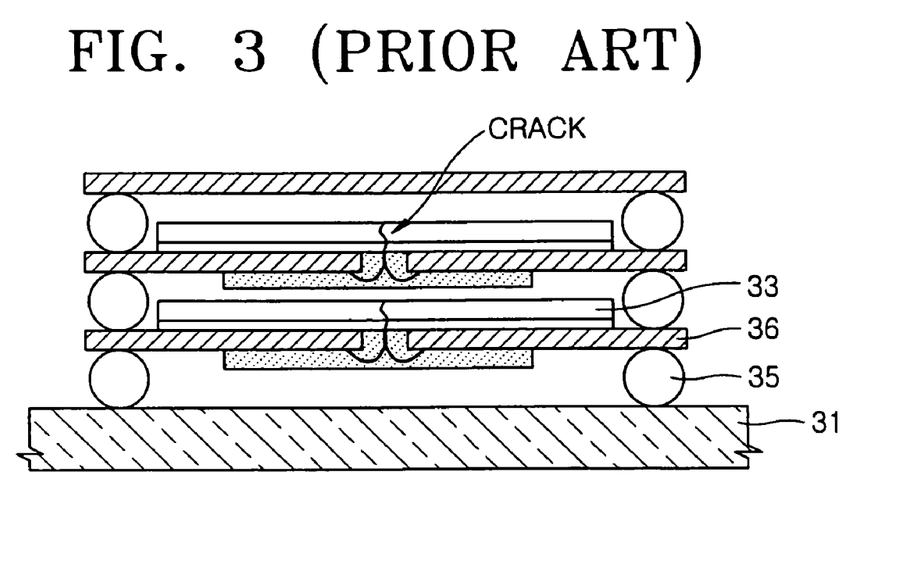
Figure 4:
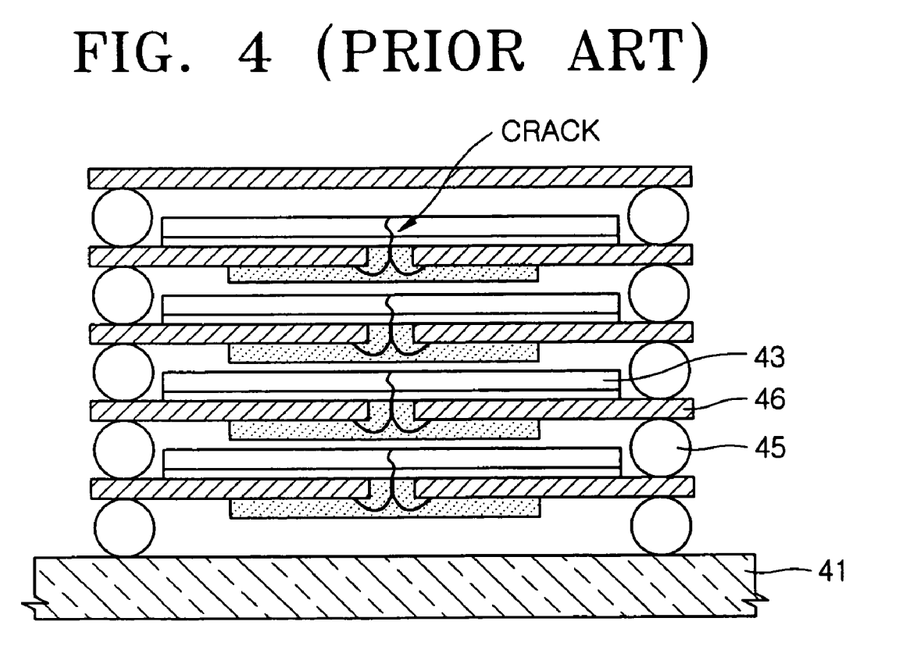

FIGS. 2 through 4 are sectional views illustrating cracks generated on memory packages on a variety of type of memory module/socket assemblies according to the prior art.

Referring to FIG. 2, a memory package 23 may be disposed on a module board 21 with solder balls 25 interposed therebetween. Because an insert force of a memory module may increase as described with reference to FIG. 1, the memory package 23 may be cracked.

Referring to FIG. 3, two memory chips 33 may be stacked on a module board 31 with solder balls 35 interposed therebetween. When two or more memory chips 33 are stacked, the memory chips 33 may be supported on supporting panels 36. In this case, the solder balls 35 may be interposed between the supporting panels 36. Likewise, due to the increased insert force of a memory module, the memory chips 33 may be cracked as shown in FIG. 3.

Referring to FIG. 4, four memory chips 43 may be stacked on a module board 41. The memory chips 43 may be supported on supporting panels 46 and solder balls 45 may be interposed between the supporting panels 46. Likewise, due to an increased insert force of a memory module, the memory chips 43 may be cracked as shown in FIG. 4.

As described above, an increase of an insert force of a memory module may cause cracks on a memory package or memory chips, and especially, when a plurality of the memory chips are stacked, and because chips may be processed to be very thin, the chips may be more vulnerable to cracks.

Figure 5:
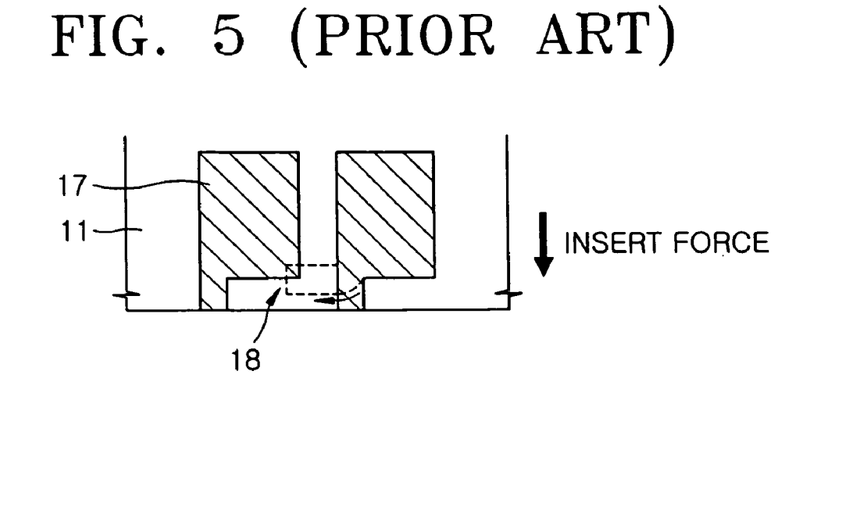
FIGS. 5 and 6 are schematic views illustrating defects on contact tabs of the memory module/socket assembly depicted in FIG. 1.
Figure 6:
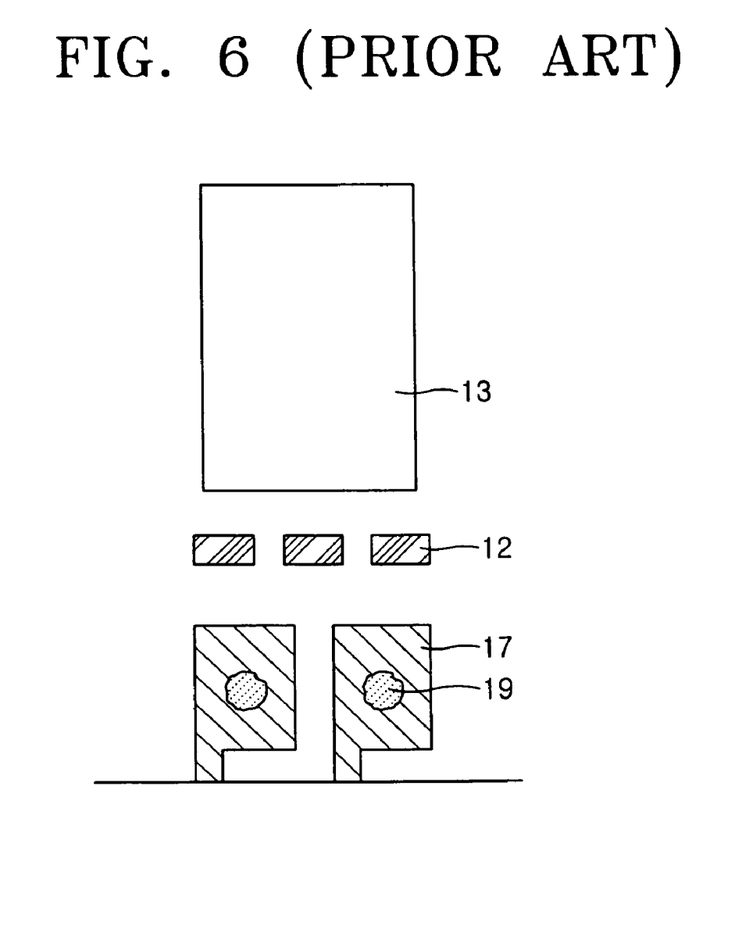

FIGS. 5 and 6 are schematic views illustrating defects on contact tabs of the memory module/socket assembly depicted in FIG. 1.

A defective tab will be described with reference to FIGS. 1, 5 and 6.

Referring to FIGS. 1 and 5, contact taps 17 may be scratched by contact pins 35 due to insert force, thereby generating a scratched portion 18. The scratched portion 18 may cause a short circuit between adjacent contact taps 17. In addition, referring to FIG. 6, a variety of contaminated layers 19 may be formed on the contact taps 17. The contamination of the contact tap 17 may be caused by a memory package 13 mounted in the vicinity of the contact taps 17 and a device, for example, a capacitor mounted on a PCB 11. That is, solder or flux that may be used to mount the memory package 13 or a device 12 may be splashed onto the contact taps 17 creating the contaminated layers 19.

As described above, in a memory module structure, because contact taps may be formed on a surface of a PCB, which may be on the same surface whereon a memory package may be mounted, it may be difficult to increase the number of contact taps and further prevent contamination and scratches on the contact taps. Furthermore, since the PCB may be inserted into a socket, the memory package may easily crack by an insert force.

SUMMARY OF THE INVENTION

Example embodiments of the present invention may provide a memory module/socket assembly on which memory packages can be densely mounted and a method of manufacturing the memory module/socket assembly.

In an example embodiment of the present invention, a printed circuit board may include a body, at least one memory package mounted on the body, and a plurality of contact taps buried in the body, a surface of the plurality of contact taps being exposed.

In another example embodiment of the present invention, a memory module/socket assembly may include a memory module including a memory package, and a printed circuit board including a body, at least one memory package mounted on the body, and a plurality of contact taps buried in the body, a surface of the plurality of contact taps being exposed, the printed circuit board having a surface on which the memory package is mounted and a socket including a housing providing a space in which the memory module is mounted, a plurality of contact pins arranged to face a corresponding one of the plurality of contact taps when the memory module is mounted in the housing, a pin supporting member supporting the plurality of contact pins such that the plurality of contact pins face the side surface of the memory module, and a pin moving member for moving the pin supporting member after the memory module is mounted in the housing so that the plurality of contact pins contact the corresponding one of the plurality of contact taps.

In another example embodiment of the present invention, a method of manufacturing a printed circuit board for a memory module may include preparing a first conductive layer, forming a conductive connecting member on the first conductive layer, forming a second conductive layer on the conductive connecting member to electronically connect the first conductive layer with the second conductive layer to form a printed circuit main board, and cutting a line crossing the conductive connecting member to expose a surface of the conductive connecting member.

BRIEF DESCRIPTION OF THE DRAWINGS

Example embodiments of the present invention will become more apparent with the description of the detail example embodiments thereof with reference to the attached drawings in which.

DETAILED DESCRIPTION OF THE EXAMPLE EMBODIMENTS OF THE INVENTION

The present invention will now be described more fully with reference to the accompanying drawings, in which example embodiments of the invention are shown. The invention may, however, be embodied in many different forms and should not be construed as being limited to the example embodiments set forth herein; rather, these example embodiments are provided so that this disclosure will be thorough and complete, and will fully convey the concept of the invention to those skilled in the art.

According to an example embodiment of the present invention, a printed circuit board (PCB) may be used as a module panel for a memory module, and a contact tap may be provided on a surface of the PCB where memory packages of a semiconductor memory device are not mounted. The contact taps may be buried in a side surface of the PCB such that exposed surfaces of the contact taps and the side surface may be located.

Figure 7:
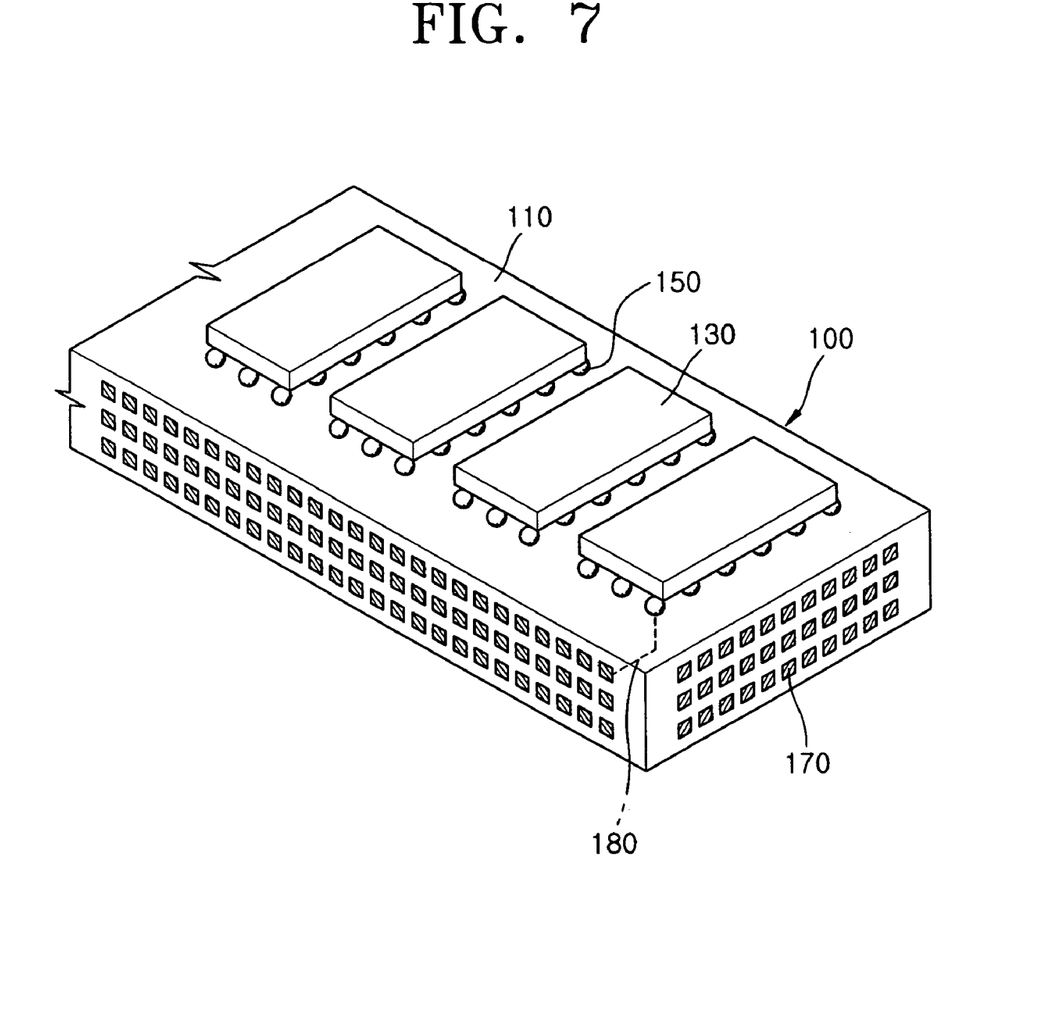
FIGS. 7 and 8 are respectively perspective and sectional views of a PCB for a memory module according to an example embodiment of the present invention.
Figure 8:
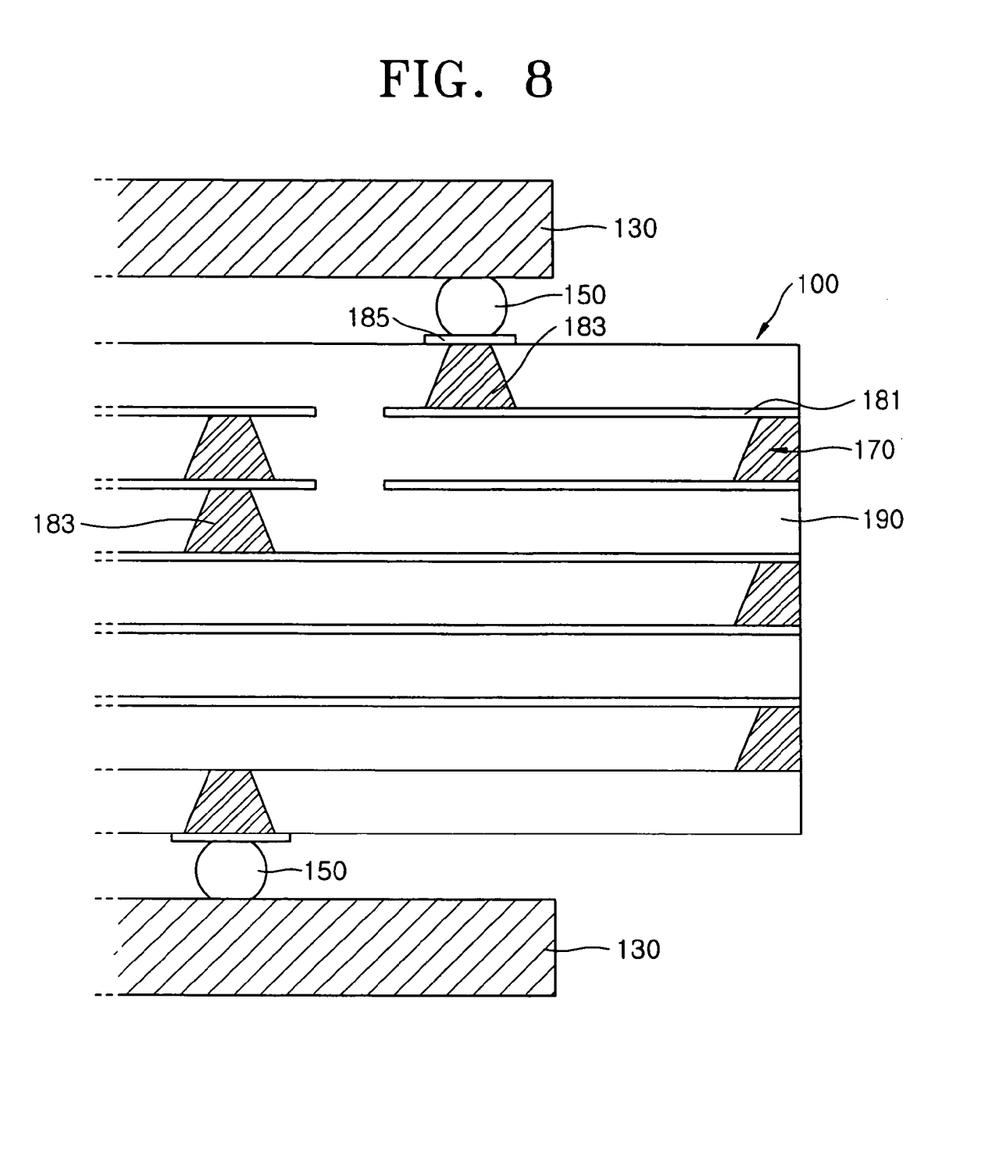

FIGS. 7 and 8 are respectively perspective and sectional views of a PCB for a memory module according to an example embodiment of the present invention.

Referring to FIGS. 7 and 8, a memory module 100 according to an example embodiment of the present invention may include a PCB 110 and a plurality of memory packages 130 mounted on the PCB 110. The memory packages 130 may be formed on top or/and bottom surfaces of the PCB 110 using, for example, solder balls 150.

Contact taps 170 may be formed on side surfaces of the PCB 110. The contact taps 170 may be buried in the side surfaces of the PCB 110 such that surfaces of the contact taps 170 may be exposed. The contact taps 170 may be formed by depositing a conductive layer formed of, for example, Au. The contact taps 170 may be formed on all four side surfaces of the PCB 110.

Because the contact taps 170 are buried, the binding force between the contact taps 170 and the PCB 110 may be improved. Therefore, damages to the contact tap 170 may be prevented even if the contact taps 170 receives an impact force.

The contact taps 170 may be electrically connected to the memory packages 130 by an internal wiring 180 buried in the PCB 110. The wiring 180 may include conductive layers 181 formed in the PCB 110 with insulating layers 190 interposed between the conductive layers 181.

The conductive layers 181 may be electrically connected to the conductive layers 190 by via connecting members 183 penetrating insulating layers 190. In addition, the via connecting members 183 may electrically connect the conductive layers 181 to adhesive pads 185 to which the solder balls 150 may adhered thereto. In other words, the internal wiring 180 may be buried in the body of the PCB 110 to connect the contact taps 170 to the solder balls 150.

In the prior art illustrated with reference to FIG. 1, although the electrical connection between contact taps 17 and memory packages 13 is not illustrated, the electrical connection may be realized by an outer wiring formed on a surface of a PCB 11. The outer wiring may be designed to be connected to solder balls 15 by, for example, via connecting members (not shown). Therefore, when the outer wiring is used, the outer wiring may be exposed on a surface of the PCB 11 and the via connecting members must be provided. This structure may cause an electrical connection path to be lengthened.

However, in example embodiments of the present invention, since the internal wiring 180 is buried in the PCB 110, an electrical connection path between contact taps 170 and solder balls 150 may be minimized. As a result, a path along which the electrical signal flows may be effectively reduced, thereby lowering parasitic capacitance or impedance that may be generated when electrical signal flows between the solder ball 150 and the contact tap 170.

A method of manufacturing a PCB according to example embodiments of the present invention will now be described.

Variety of processes, for example, a photolithography for forming a wiring and via, a laser high density interconnection (HDI), Any-Layer, Inner Via Hole (ALIVH), $B^2$it, and Neo Manhattan Bump Interconnection (NMBI) may be used to manufacture the PCB according to example embodiments of the present invention. In other words, no new manufacturing equipment may be required to manufacture a PCB according to example embodiments of the present invention.

Figure 10:
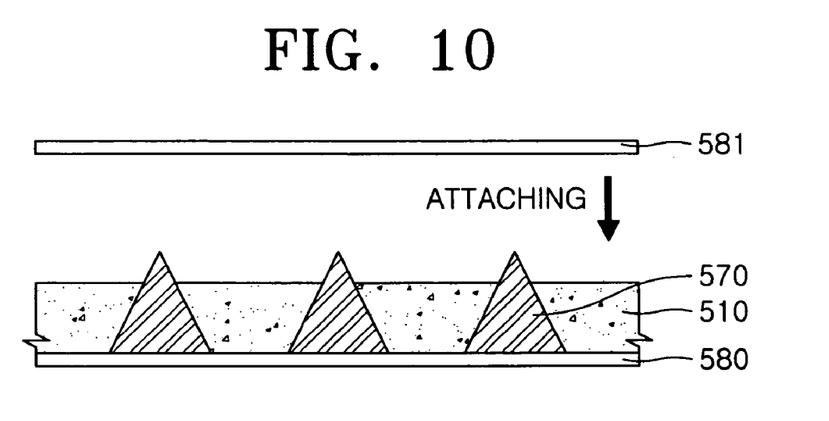
Figure 11:
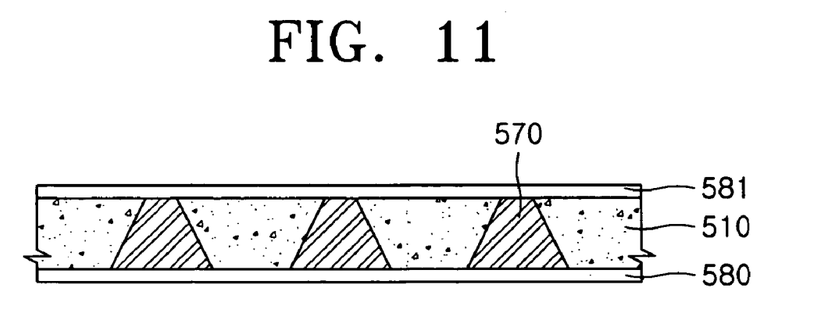
Figure 12:
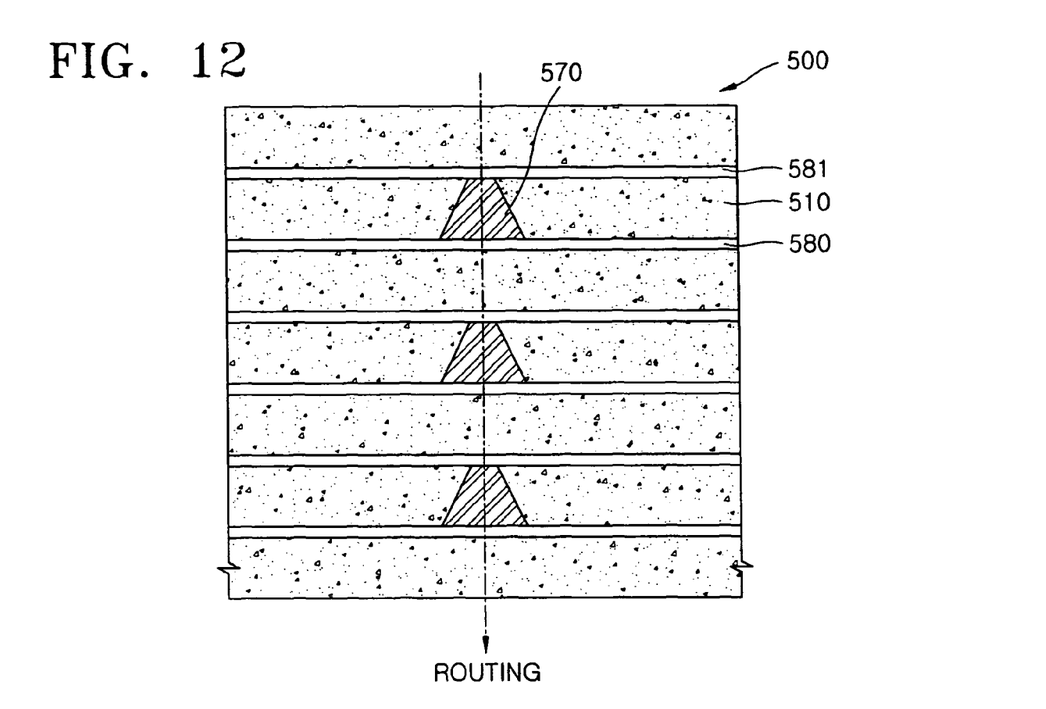
Figure 13:
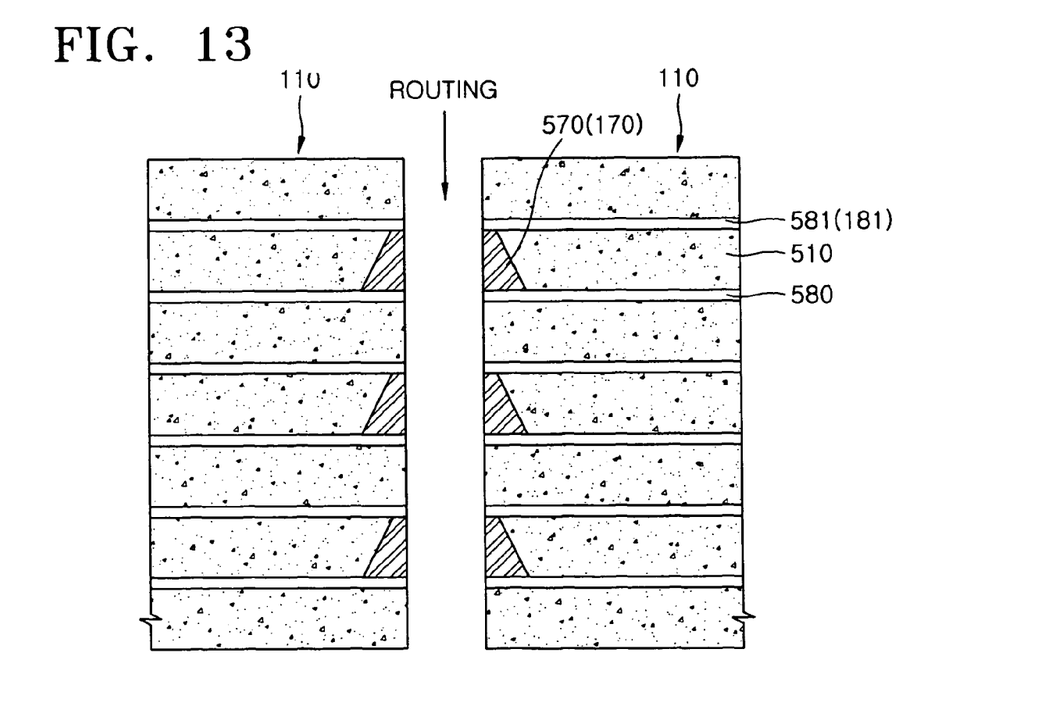

FIGS. 9 through 13 are sectional views illustrating a method of manufacturing a PCB for a memory module according to an example embodiment of the present invention;

Referring to FIGS. 9 through 13, in order to provide an individual PCB, a printed circuit main board 500 may be first formed as illustrated in FIG. 12. The printed circuit main board 500 may be processed through a routing process to provide an individual PCB 110 as illustrated in FIG. 13.

The printed circuit main board 500 illustrated in FIG. 12 may include a plurality of conductive layers 580 and a plurality of insulating layers 510 disposed between the conductive layers 580. A plurality of conductive connecting members 570 may be formed to penetrate the insulating layers 510, thereby electrically interconnecting the conductive layers 580. As indicated by dotted-line arrow in FIG. 12, the conductive connecting members 570 may be arranged on a common imaginary cutting surface line.

As shown in FIG. 13, the printed circuit main board 500 may be cut along the line (the dotted-line) crossing a middle portion of the conductive connecting members 570, thereby providing individual PCBs 110 on which contact taps 170.

The printed circuit main board 500 may be manufactured by applying variety of well-known processes for manufacturing a PCB.

Figure 9:
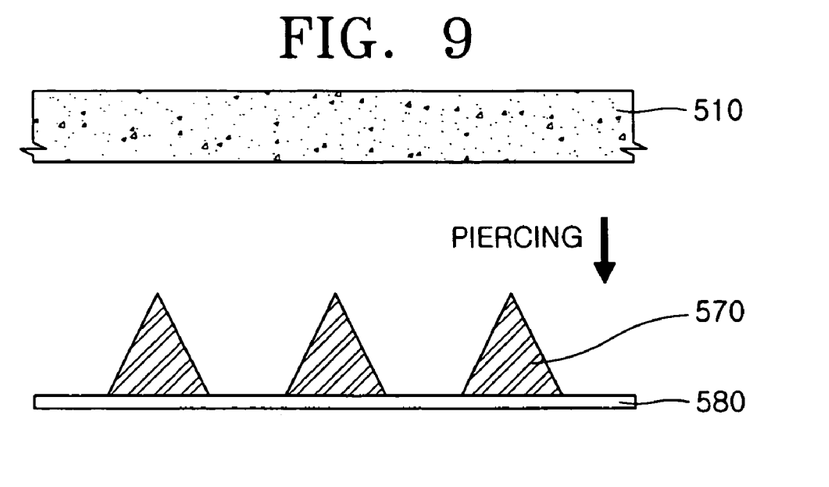
FIGS. 9 through 13 are sectional views illustrating a method of manufacturing a PCB for a memory module according to an example embodiment of the present invention.

For example, as illustrated in FIG. 9, a conductive layer 580 formed of, for example, a Cu foil may be provided and bumps or conductive connecting members 570 may be formed on the conductive layer 580. The conductive connecting members 570 may be formed of Ag paste through a printing process. The conductive connecting members 570 may be formed in a circular cone shape or a polygonal cone shape.

An insulating layer 510 may be attached on the conductive layer 580 such that the conductive connecting members 570 may pierce the insulating layer 510. Therefore, upper portions of the conductive connecting members 570 may be exposed out of the insulating layer 510.

The insulating layer 510 may be formed by attaching a B-stage prepreg. B-stage means that hardening resin is in a semi-hardened state where the resin is not completely hardened. Therefore, the conductive connecting members 570 can easily pierce the insulating layer 510. A process for completely hardening the insulating layer 510 may be further performed.

In FIG. 10, another conductive layer 581 may be attached on the insulating layer 510 to contact the conductive connecting members 570. The conductive layer 581 may be formed of, for example, a Cu foil. In FIG. 11, a laminating process may be performed to form an intermediate structure where the conductive connecting members 570 may be interposed between the conductive layers 580 and 581. The processes described with reference with FIGS. 9 through 11 may be repeated to form a printed circuit main board 500 where the intermediated structures are stacked on top of each other as shown in FIG. 12. By routing the printed circuit main board 500, the individual PCB illustrated in FIG. 13 may be obtained.

The method of manufacturing the individual PCB 110 may not be limited to the above described method, but rather other well known methods may be used to manufacture the PCB.

In the above-described memory module of the example embodiment of the present invention, because contact taps 170 may be provided on side surfaces, a conventional socket (30 in FIG. 1) may not be associated with the memory module of the example embodiment of the present invention. Therefore, there is a need for a socket that can be assembled with the memory module of the example embodiment of the present invention.

Figure 14:
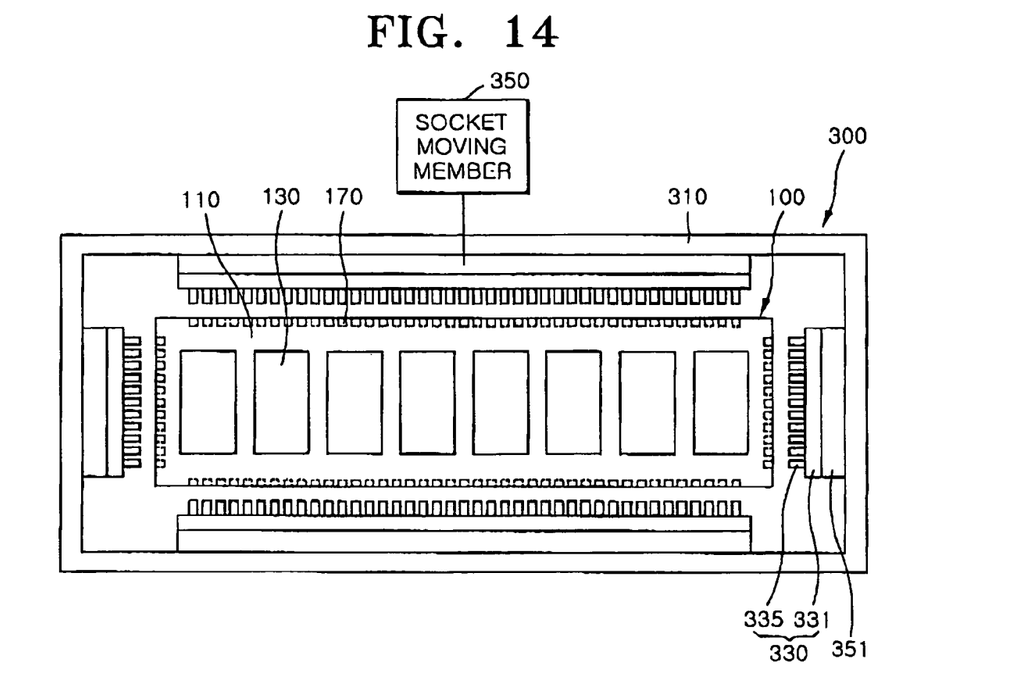
FIGS. 14 and 15 are respectively plane and sectional views of a memory module/socket assembly according to an example embodiment of the present invention.
Figure 15:
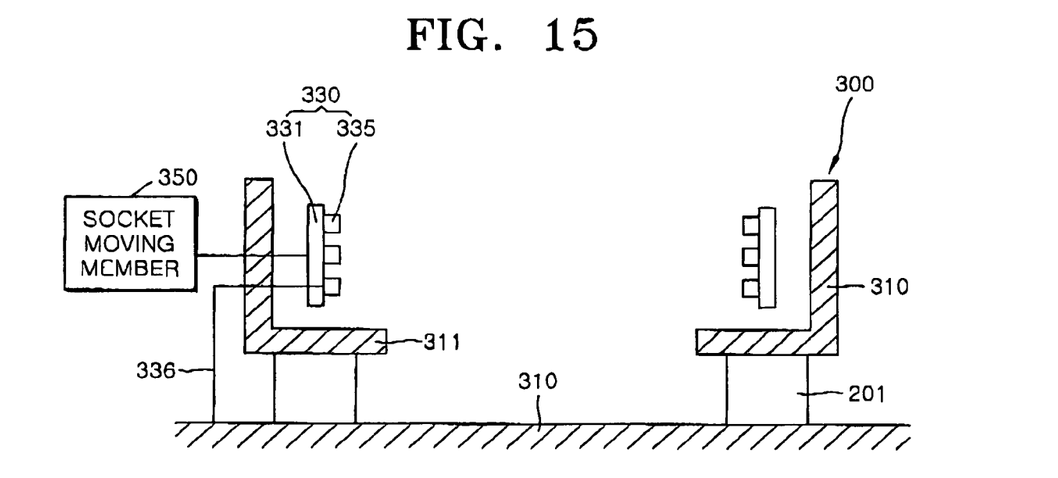

FIGS. 14 and 15 are respectively plane and sectional views of a memory module/socket assembly according to an example embodiment of the present invention.

Referring to FIGS. 14 and 15, a socket 300 that can be associated with a memory module of the example embodiment of the present invention may include a socket housing 310, connecting members 330, and a socket pin moving members 350.

The socket housing 310 may be formed in a box-shape having an opened top so that it can provide a space for installing the memory module 100. When a plurality of the memory packages 130 are mounted on opposite surfaces of the memory module 100, the socket housing 310 may be provided at a bottom with an opened portion so that the memory packages 130 arranged on a bottom of a PCB do not contact other members. Therefore, the memory module 100 may be mounted on the socket housing 310 such that a bottom edge of the memory module 100 may be supported on a bottom portion 311 of the socket housing 310.

The memory module 100 may be mounted on a desired internal location of the housing 310. Minimal force and/or operation relating to an insertion may be applied.

Contact pins 335 may be formed on the connecting members 330 such that the contact pins 335 may be arranged to correspond to the contact taps 170 formed on the side surfaces of the PCB 110 of the memory module 100. The contact pins 335 may be formed to correspond in the number and location to the contact taps 170 formed on the four side surfaces of the memory module 100. Supporting members 331 for supporting the contact pins 335 may be provided to face the PCB 110. The supporting members 331 may be formed of electric flat plates. The contact pins 335 may be formed of signal connecting pins, for example, pogo pins.

Generally, the socket housing 310 may be electrically connected to a main board of an electronic device (not shown), for example, a computer. Therefore, the contact pins 335 may be connected to the main board. The electrical connection between the contact pins 335 and the main board may be realized by a flexible electrical connecting member 336, for example, a cable, because the contact pins 335 may be designed to move to contact the contact taps 170 of the memory module 100 mounted in the housing 310.

The contact pins 335 may be located away from the contact taps 170 of the memory module 100 mounted in the socket housing 310, to thereby not to apply additional force to the memory module 100 when the memory module 100 is mounted in the housing 310. Once the memory module 100 is mounted in the housing 310, the socket pin moving members 350 may be operated to move the connecting members 330 so that the contact pins 355 may contact the corresponding contact taps 170.

Figure 16A:
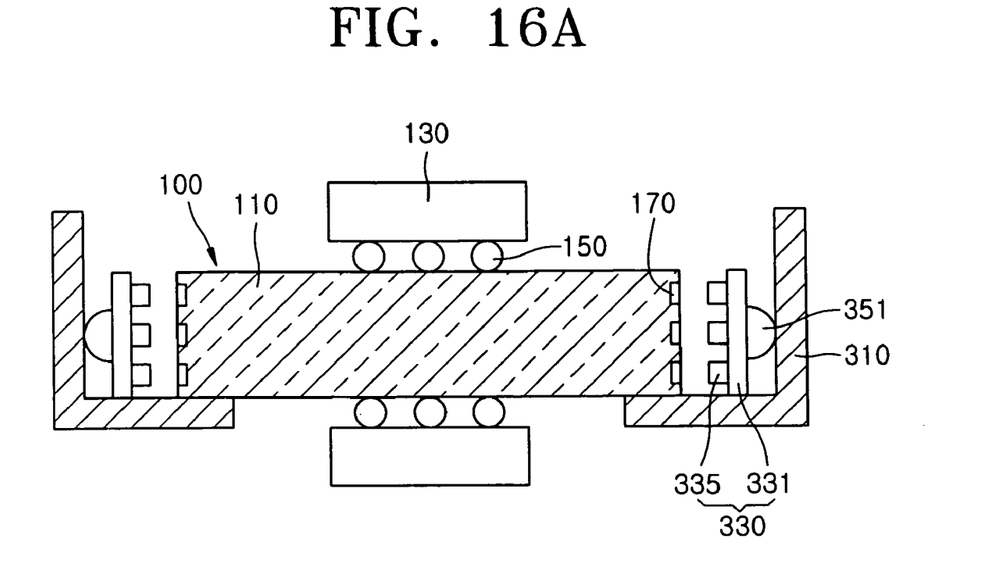
FIGS. 16a and 16b are sectional views illustrating a connecting method using a memory module/socket assembly according to an example embodiment of the present invention.
Figure 16B:
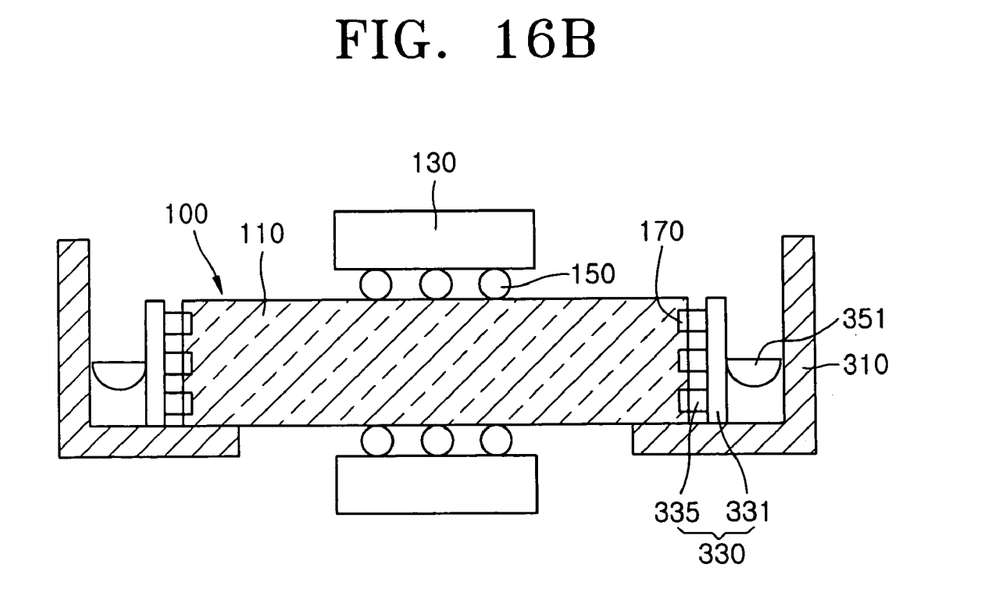

FIGS. 16a and 16b are sectional views illustrating a connecting method using a memory module/socket assembly according to an example embodiment of the present invention.

Referring to FIG. 16a, when a memory module 100 is mounted in a socket housing 310, contact pins 335 of pin connecting members 330 may be located away from contact taps 170. As pin moving members 350 and camshafts 351 may be installed on a rear end of the pin connecting members 330.

When the camshafts 351 rotate after the memory module 100 is mounted in the socket housing 310, as illustrated in FIG. 16b, the pin connecting members 330 may be pushed toward a PCB 110. Accordingly, the contact pins 335 may contact the contact taps 170 formed on the PCB 110.

Accordingly, no additional force may be applied to a memory package 130 of the memory module 100 when the contact pins 335 contact the contact taps 170. When the memory package 130 is formed with a chip scale thickness or a plurality of packages 130 are stacked one another, the strength of the package 130 may be reduced. The reduction in the strength of the package may cause cracks. However, according to example embodiments of the present invention, because no additional force may be applied to a memory package of a memory module when contact pins contact contact taps, cracks caused by the reduction in a strength of the memory package may be prevented. Furthermore, since contact pins perpendicularly contact the contact taps, no sheer stress may be applied to the contact taps when the contact pins contact the contact taps. Therefore, damages of the contact taps 170 may be effectively reduced and/or presented.

In FIG. 15, although a connecting member 330 having a pogo pin type contact pins 335 was described, the example embodiments of the present invention may not be limited thereto. The connecting member 330 may be structured using pressure conductive rubber (PCR) or other well known connecting members.

Figure 17:
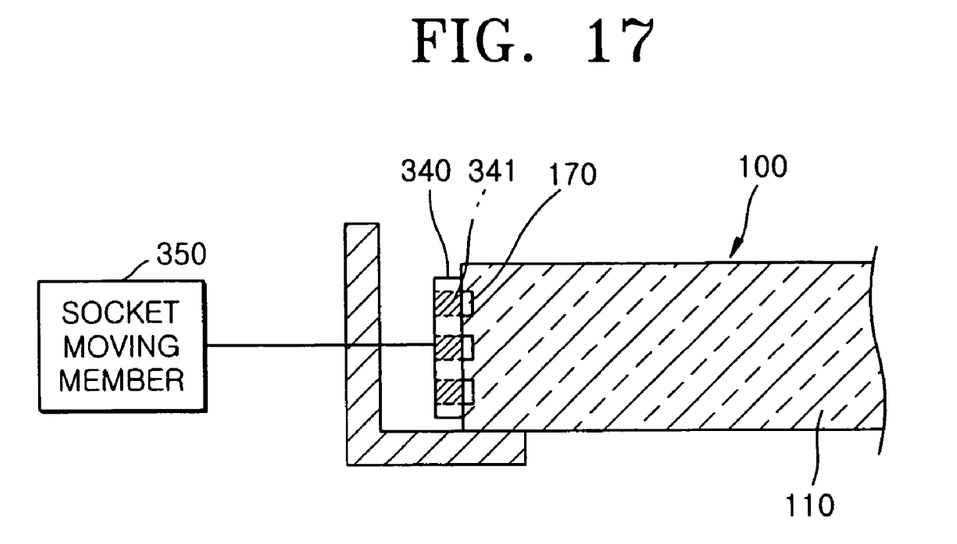
FIG. 17 is a sectional view of a memory module/socket assembly according to another example embodiment of the present invention.

FIG. 17 is a sectional view of a memory module/socket assembly according to another example embodiment of the present invention.

Referring to FIG. 17, a PCR connecting member 340 may be structured in a form of an erected flat plate. In other words, the PCR connecting member 340 may be formed of the PCR in which conductive particles are locally implanted in medium portions. Portions 341 where the conductive particles may be implanted have conductivity when pressed and other portions may be formed of rubber, which is a resistance material. The portions 341 may be formed to face the contact taps 170, thereby functioning as a path along which the electrical signal flows when they contact the contact taps 170. Therefore, the PCR connecting member 340 may perform a function similar to that of the connecting member 330 illustrated in FIG. 15.

According to example embodiments of the present invention, because the number of contact taps of a memory module may be increased, it may be possible to realize a high density memory module. In addition, because the contact taps may be formed on side surfaces of a PCB, contamination of the contact taps by solder balls or flux during a mounting process of a package or another device on a top or bottom of the PCB may be effectively prevented.

In addition, because the contact taps may be buried in the side surface of the PCB, the binding force of the contact taps to the PCB may increase. Therefore, defects, for example, cracks on contact taps may be effectively prevented. Furthermore, because an electrical connection path between the contact taps and the memory packages may be realized by an internal wiring buried in the PCB, a length of the electrical connection path may be reduced, thereby lowering parasitic capacitance or impedance that may be generated when the electrical signal flows between a solder ball and a contact tap. As a result, a signal transmission speed may increase, thereby realizing a high speed memory module.

In addition, because contact pins provided on a socket may be designed to contact contact taps by horizontally moving a connecting member after a memory module has been mounted, the memory module may be mounted in a housing with no insert force. Defects, for example, cracks in a package caused by insert force when a memory module is inserted in a socket may be prevented.

While example embodiments of the present invention has been shown and described with reference to example embodiments thereof, it will be understood by those of ordinary skill in the art that various changes in form and details may be made therein without departing from the scope of the example embodiments of the present invention.

What is claimed is:

1. A memory module/socket assembly comprising:
   a memory module including a memory package, and a printed circuit board, the printed circuit board having a surface on which at least one memory package is mounted, the printed circuit board including,
      a body, the at least one memory package mounted on a main surface of the body, and
      a plurality of contact taps buried in the body, a surface of each of the plurality of contact taps being exposed, the plurality of contact taps arranged on at least two side surfaces of the body, the side surfaces being perpendicular to the main surface; and
   a socket including
      a housing providing a space in which the memory module is mounted;
      a plurality of contact pins each arranged to face a corresponding one of the plurality of contact taps when the memory module is mounted in the housing,
      a pin supporting member supporting at least one of the plurality of contact pins such that the at least one of the plurality of contact pins faces at least one side surface of the memory module, and
      a pin moving member for moving the pin supporting member after the memory module is mounted in the housing so that the at least one of the plurality of contact pins contacts the corresponding one of the plurality of contact taps.

2. The memory module/socket assembly of claim 1, further comprising an internal wiring buried in the body to electrically connect the contact tap to the memory package.

3. The memory module/socket assembly of claim 2, wherein the internal wiring includes conductive layers buried in the body and a conductive via connecting member interconnecting the conductive layers.

4. The memory module/socket assembly of claim 1, wherein the plurality of contact taps are arranged on four side surfaces of the printed circuit body in lines and the plurality of pins are arranged to face the four side surfaces of the body.

5. The memory module/socket assembly of claim 1, wherein the pin supporting member is spaced away from a side surface of the body; and
   the at least one of the plurality of pins includes a pogo pin horizontally supported by the pin supporting member.

6. The memory module/socket assembly of claim 1, wherein the pin supporting member includes an electric flat plate having pressure conductive rubber having a conductive portion functioning as the at least one of the plurality of pins.

7. The memory module/socket assembly of claim 1, wherein the pin moving member includes a camshaft for moving the pin supporting member toward the at least one side surface of the body.

8. The memory module/socket assembly of claim 1, wherein the housing includes a bottom portion contacting and supporting an edge of a body of the memory module.

9. The memory module/socket assembly of claim 1, wherein the pin supporting member is located in between the memory module and the housing, and
   the pin moving member is located in between the pin supporting member and the housing.

10. A memory module/socket assembly comprising:

a memory module including a memory package and a printed circuit board, the memory package mounted on a main surface of the printed circuit board; and a socket including a housing providing a space in which the memory module is mounted, a plurality of contact pins each arranged to face a corresponding one of a plurality of contact taps when the memory module is mounted in the housing, a pin supporting member supporting the plurality of contact pins such that the plurality of contact pins face at least one side surface of the memory module, the at least one side surface perpendicular to the main surface, and a pin moving member for moving the pin supporting member after the memory module is mounted in the housing so that each of the plurality of contact pins contacts the corresponding one of the plurality of contact taps.

* * * * *